United States Patent [19]
Kim

[11] Patent Number: 6,078,543
[45] Date of Patent: Jun. 20, 2000

[54] REFRESH SCHEME FOR REDUNDANT WORD LINES

[75] Inventor: Dae-Jeong Kim, Kyungki-Do, Rep. of Korea

[73] Assignee: LG Semicon Co., Ltd., Cheongju, Rep. of Korea

[21] Appl. No.: 09/209,178

[22] Filed: Dec. 10, 1998

[30] Foreign Application Priority Data

May 13, 1998 [KR] Rep. of Korea ...................... 98/17229

[51] Int. Cl.[7] .................................................. G11C 8/00
[52] U.S. Cl. ................ 365/230.03; 365/222; 365/230.06
[58] Field of Search ............................... 365/230.03, 222, 365/230.06, 189.07

[56] References Cited

U.S. PATENT DOCUMENTS

| | | |
|---|---|---|
| 5,426,603 | 6/1995 | Nakamura et al. .................... 365/149 |
| 5,463,557 | 10/1995 | Nakano et al. ......................... 364/470 |
| 5,469,559 | 11/1995 | Parks et al. ............................. 365/222 |
| 5,528,552 | 6/1996 | Kamisaki .............................. 365/238.5 |

*Primary Examiner*—David Nelms
*Assistant Examiner*—David Lam
*Attorney, Agent, or Firm*—Fleshner & Kim, LLP

[57] ABSTRACT

A memory device and method are provided that permits repair a predetermined normal word line by a redundant word line in an identical bank, for example, in a multi-bank device. Each bank of the memory device includes a single memory block of a plurality of memory blocks having redundant word lines. A refresh operation can be performed in each banks by simultaneously driving normal word lines and the redundant word lines when each the memory blocks are accessed with the exception of the single memory block including the redundant word lines.

20 Claims, 3 Drawing Sheets

FIG. 3A REF 
FIG. 3B NWEN 
FIG. 3C RWEN 

REFRESH SCHEME FOR REDUNDANT WORD LINES

BACKGROUND OF THE INVENTION

1. Field of the Invention

The present invention is directed to a semiconductor device, and in particular, to a synchronous dynamic random access memory (SDRAM) of a semiconductor memory.

2. Background of the Related Art

When a defect is found in any of numerous cells in a memory, the memory is classified inferior and not used. As the integration of the memory is increased, the likelihood of a defect generated in a few cells is high. In this case, to classify and not use an entire memory as inferior is an inefficient method that lowers yield. Therefore, when the defect is generated in the memory cell, a related art method of increasing the yield substitutes a spare cell provided in the memory for a defective cell.

For a highly integrated memory, a merged bank architecture MBA reduces chip size by dividing the memory into more than four banks and shares an X-address predecoder or a control block among the respective banks.

FIG. 1 is a block diagram illustrating a related art refresh scheme for redundant word lines in a memory. A core array 10 is a first bank architecture including a plurality of memory blocks BK0–BKn that are distinguished from one another by upper and lower bit line sense amplifiers BLSA. Each of the respective memory blocks BK0–BKn has normal word lines NWL and redundant word lines RWL.

A fuse read only memory (ROM) array 20 includes a plurality of fuse ROMs. The plurality of the fuse ROMs are equal in number to the memory blocks BK0–BKn. The respective fuse ROMs are programmed with address information regarding the redundant word lines to repair.

A refresh counter 30 serves to sequentially generate an internal address during a refresh operation. A comparator 40 sequentially compares an external address with the address information programmed in the fuse ROM array 20 during a normal operation. The comparator 40 sequentially compares the address information programmed in the fuse ROM array 20 with the internal address outputted from the refresh counter 30 during a refresh operation. When two addresses are hit, a redundant word line enable signal RWEN is activated. On the other hand, when the two addresses are missed, a normal word line enable signal NWEN is activated.

An X-address predecoder 50 outputs an upper coding signal that is a memory block selecting signal and a lower coding signal that is a word line selecting signal by decoding the external address (X-address) during the normal operation and decoding the internal address that is outputted from the refresh counter 30 during the refresh operation. For instance, a 16M data random access memory (DRAM), the X-address predecoder 50 uses addresses A8~A11 to of the external addresses A0~A11 to select one memory block from the plurality of memory blocks BK0–BKn. The X-address predecoder uses the other addresses A0~A7 to select one word line from 256 word lines in a selected memory block.

Row decoder and word line drivers 60-1~60-n are operated by the normal word line enable signal NWEN from the comparator 40. Pursuant to the upper coding signal outputted from the X-address predecoder 50, the row decoder and word line drivers 60-1~60-n select one memory block from the plurality of memory blocks BK0–BKn by enabling the bit line sense amplifiers BLSA. In accordance with the lower coding signal outputted from the X-address predecoder 50, the row decoder and word line drivers 60-1~60-n drive one word line of the 256 word lines in the selected block.

Redundant row decoder and word line drivers 61-1~61-n are operated by the redundant word line enable signal RWEN from the comparator 40. Pursuant to the lower coding signal that is outputted from the X-address predecoder 50, the redundant row decoder and word line drivers 61-1~61-n drive a corresponding redundant word line RWL in the selected block.

The operation of the related art refresh scheme for redundant word lines in the memory will now be described. During the normal operation of the memory, the X-address predecoder 50 outputs the upper coding signal and the lower coding signal by decoding the external address (X-address). The comparator 40 sequentially compares the inputted external address with the address information programmed in the fuse ROM array 20. When two addresses are the same (e.g., hit), the redundant word line enable signal RWEN is active. When the two addresses are missed, the comparator 40 makes the normal word line enable signal NWEN active.

When the normal word line enable signal NWEN is active in the comparator 40, the plurality of row decoders and word line drivers 60-1~60-n are operated. In accordance with the upper coding signal outputted from the X-address predecoder 50, the operated row decoders and word line drivers 60-1~60-n enable the corresponding bit line sense amplifiers BLSA and select one memory block from the plurality of memory blocks BK0–BKn, for example, the memory block BK0. At the same time, pursuant to the lower coding signal outputted from the X-address predecoder 50, a corresponding one of the row decoder and word line drivers 60-1-~0-n drive one normal word line of the 256 normal word lines in the selected memory block BK0.

During this operation, when the external address and the address information programmed in the fuse ROM array 20 are equal (e.g. hit) the redundant word line enable signal RWEN is activated from the comparator 40. The row decoder and word line driver 60-1 is disabled and the redundant row decoder and word line driver 61-1 is enabled.

Therefore, in accordance with the lower coding signal outputted from the X-address predecoder 50, the redundant row decoder and word line driver 61-1 drives the redundant word line RWL in the selected memory block BK0. In this manner, the normal word line NWL is replaced by the redundant word line RWL in the memory block BK0.

That is, during the normal operation, the external address and the address information programmed in the fuse ROM array 20 are missed to activate the normal word line enable signal NWEN and drive the normal word line NWL. On the other hand, when the two addresses are hit to activate the redundant word line enable signal RWEN, the redundant word line RWL is driven. Accordingly, when the defect is generated in any of the memory cells, the inferior cell can be avoided or repaired by replacing the normal word line NWL with the redundant word line RWL.

The refresh operation of the related art refresh scheme of the memory in FIG. 1 will now be described. In accordance with a refresh signal, the refresh counter 30 sequentially generates the internal address and provides it to the comparator 40. The X-address predecoder 50 outputs the upper coding signal and the lower coding signal by decoding the internal address from the refresh counter 30.

At this time, the comparator 40 sequentially compares the inputted internal address with the address information programmed in the fuse ROM array 20. When the two addresses are the same, the redundant word line enable signal RWEN is activated. On the other hand, when the two addresses are different, the normal word line enable signal NWEN is activated.

The X-address predecoder 50 outputs the upper coding signal and the lower coding, signal by decoding the internal address inputted from the refresh counter 30. As described above, the plurality of row decoder and word line drivers 60-1~60-n are enabled by the normal word line enable signal NWEN. Then, pursuant to the upper coding signal outputted from the X-address predecoder 50, the row decoder and word line drivers 60-1~60-n select one memory block from the plurality of memory blocks BKO–BKn. Pursuant to the lower coding signal, the row decoder and word line drivers 60-1~60-n carry out the refresh operation in the selected memory block, for example, the memory block BK0, by sequentially driving the normal word lines NWL.

In addition, when the internal address is equal to the address information in the fuse ROM array 20, the redundant row decoder and word line driver 61-1 is enabled by the redundant word line enable signal RWEN. Then, pursuant to the lower coding signal outputted from the X-address pre-decoder 50, the redundant row decoder and word line driver 61-1 performs the refresh operation by driving the redundant word line RWL In the selected memory block.

Namely, during the refresh operation, when internal address and the address information programmed in the fuse ROM array 20 are different to activate the normal word line enable signal NWEN, the refresh operation is carried out by driving the normal word line. On the other hand, when the two addresses are equal to activate the redundant word line enable signal RWEN, the refresh operation is performed by driving the redundant word line RWL.

As described above, the related art refresh scheme has various disadvantages. The related art refresh scheme for the redundant word lines has a disadvantage in that a repair of the redundant word line can be carried out solely within an identical memory block, which results in the reduction of efficiency of the redundant word line or the fuse.

The above references are incorporated by reference herein where appropriate for appropriate teachings of additional or alternative details, features and/or technical background.

SUMMARY OF THE INVENTION

An object of the present invention is to provide a semiconductor memory device and method that obviates at least one of the problems caused by disadvantages or limitations in the related art.

Another object of the present invention to provide a refresh scheme for redundant word lines in a semiconductor memory device and method that repairs a prescribed normal word line by a redundant word line within an identical bank.

Another object of the present invention is to provide a refresh scheme for redundant word lines that performs a refresh operation in a memory in which the redundant word lines are located in a predetermined bank.

Another object of the present invention to provide a redundant word lines in a merged bank architecture and method that refresh the redundant word lines and normal word lines concurrently and without distinction by respective banks.

In order to achieve at least the above-described objects in a whole or in parts, there is provided a refresh scheme for redundant word lines that performs a refresh operation by substantially simultaneously driving a normal word line and a redundant word line, when a plurality of memory blocks are accessed, except a specific memory block including the redundant word lines.

To further achieve at least the above-described objects in a whole or in parts, there is provided a memory device, according to the present invention that includes a plurality of banks, wherein each of the banks has a plurality of sense amplifiers, and a plurality of memory blocks, each of the memory blocks coupled to a corresponding sense amplifier, wherein each of the memory blocks has word lines, and wherein a designated one of the memory blocks has redundant word lines, a plurality of drivers for the word lines, wherein each of the drivers is coupled to a corresponding memory block, and a designated driver coupled to the designated memory block to drive the redundant word lines and a selecting circuit that determines whether a selection signal corresponds to a stored information to select one of the plurality of drivers and the designated driver in a refresh operation.

To further achieve at least the above-described objects in a whole or in parts, there is provided a memory device, according to the present invention that includes a plurality of banks, where each of the banks has a plurality of sense amplifiers and a plurality of memory blocks, each of the memory blocks coupled to a corresponding sense amplifier, wherein each of the memory blocks has word lines, and wherein a prescribed one of the memory blocks has both the word lines and redundant word lines, a predecoder that decodes an address signal to output an upper coding signal and a lower coding signal, a latch and compare unit that compares prestored address information with the upper coding signal during the refresh operation to activate both a normal word line enable signal and a redundant word line enable signal when the compared information arc equivalent, and a plurality of row decoder and word line drivers that select a memory block of the plurality of memory blocks according to the upper coding signal, and wherein according to the lower coding signal, the redundant word line enable signal and the word line enable signal two of the plurality of row decoder and word line drivers respectively drive a selected word line of the normal word lines in the selected memory block and the redundant word lines in the prescribed memory block, concurrently.

To further achieve at least the above-described objects in a whole or in parts, there is provided a method of operating a memory that includes a plurality of banks, each of the banks having a plurality of memory blocks with word lines, where each of the memory blocks is coupled to a corresponding sense amplifier, the method according to the present invention including providing a single prescribed one of the plurality of memory blocks in each of the plurality of banks with redundant word lines, connecting each of a plurality of drivers to a corresponding memory block receiving a selection signal and determining whether the selection signal is equivalent to a stored information to select one of the plurality of drivers in a normal operation and to select two of the drivers in a refresh operation when the selection signal is equivalent to the stored information, wherein during the refresh operation a selected word line of the word lines in a selected memory block and a selected redundant word line in the redundant word lines are concurrently driven by the two drivers.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 3A–3C respectively illustrate exemplary waveforms of a refresh signal, a normal word line enable signal and a redundant word line enable signal.

DETAILED DESCRIPTION OF PREFERRED EMBODIMENTS

Figure 1:
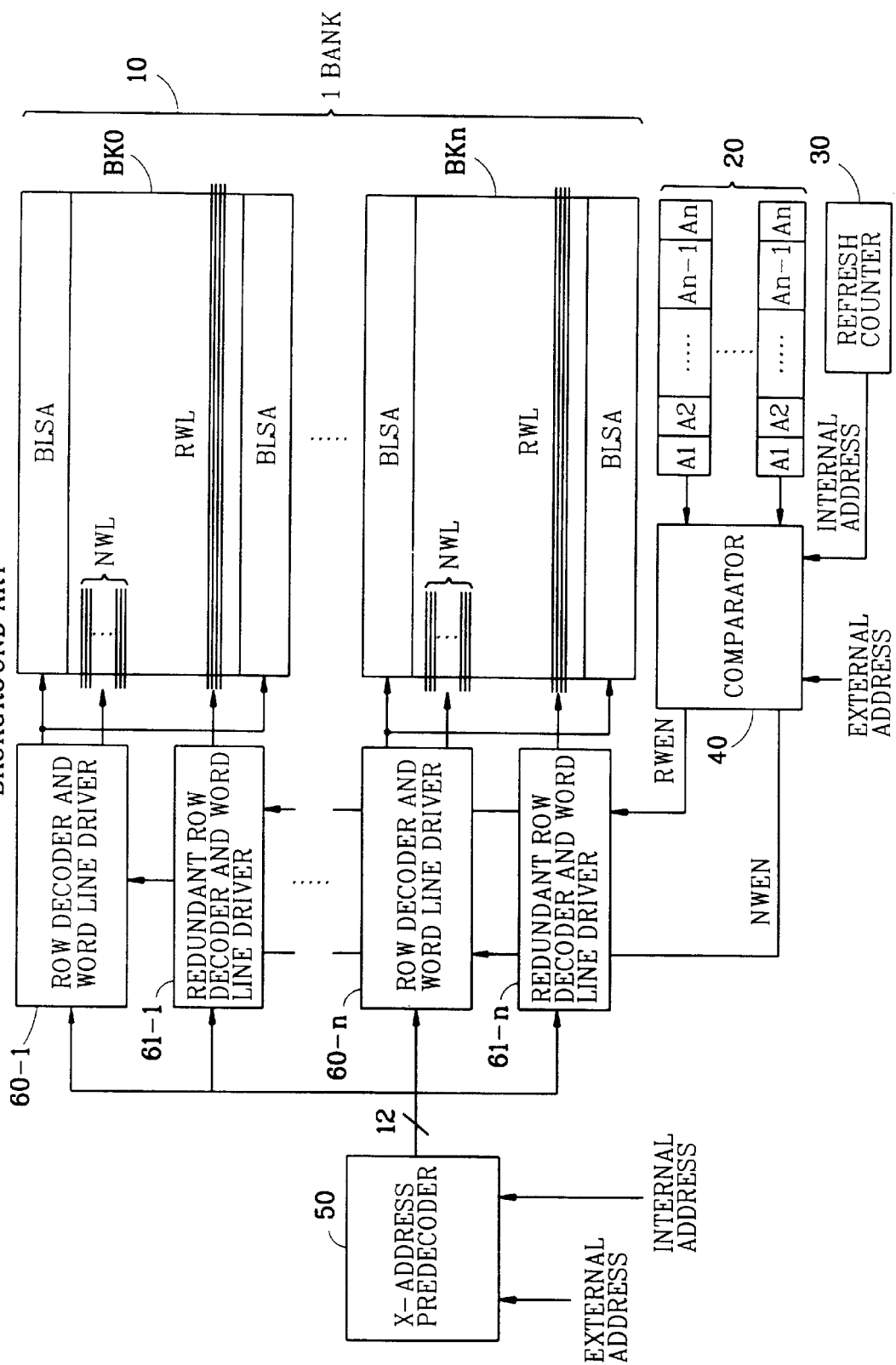
FIG. 1 is a block diagram illustrating a related art semiconductor memory device with a merged bank architecture refresh scheme for redundant word lines.
Figure 2:
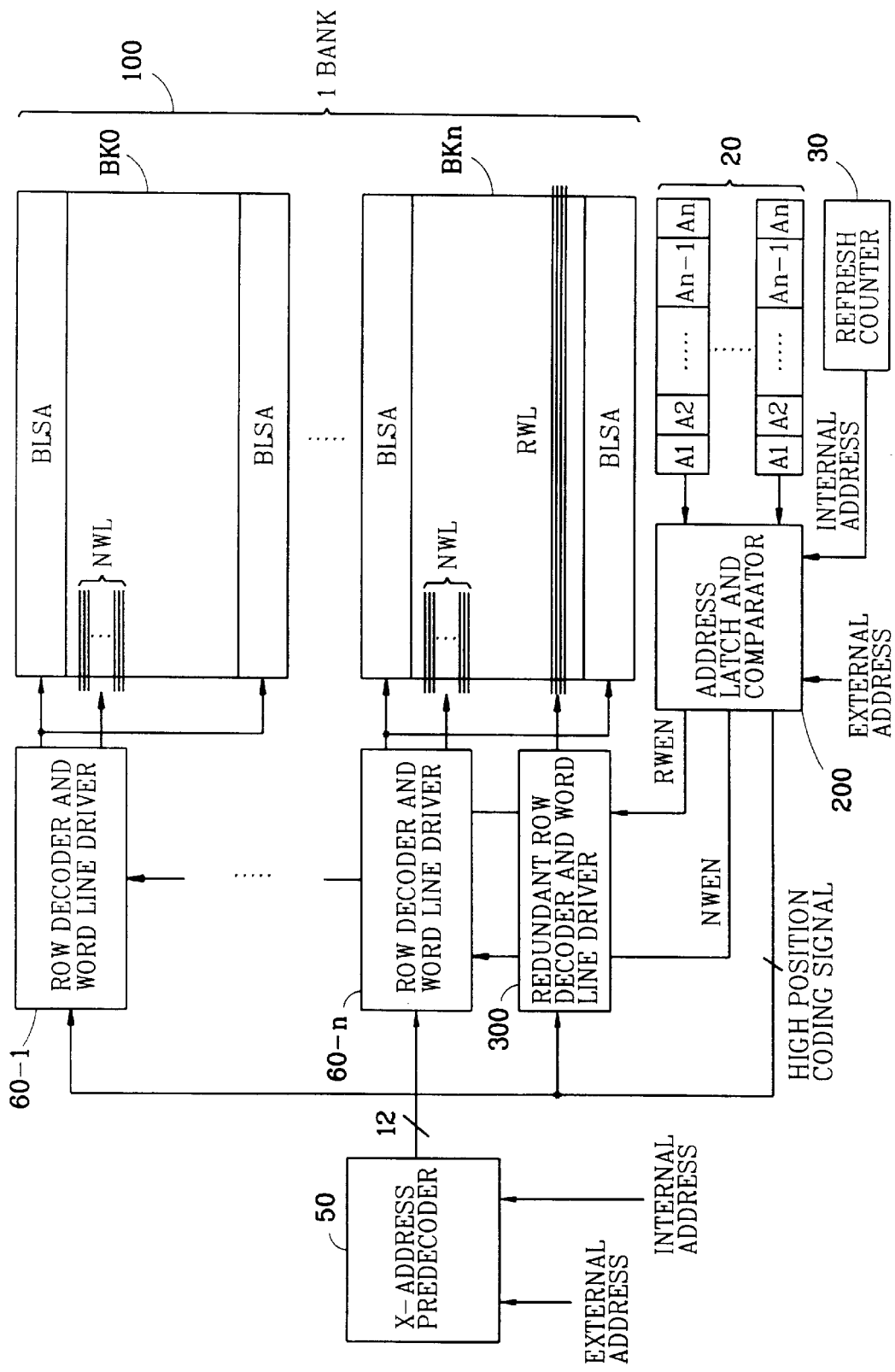
FIG. 2 is a block diagram illustrating a memory device with redundant word lines in accordance with a preferred embodiment according to the present invention.

FIG. 2 is a block diagram of an exemplary semiconductor memory device with a merged bank architecture illustrating a preferred embodiment of a refresh scheme for redundant word lines in accordance with the present invention. The semiconductor memory device includes a core array 100 being a first bank that includes a plurality of memory blocks BK0–BKn distinguished from one another by bit line sense amplifiers BLSA. In addition, the memory blocks BK0–BKn-1 include only normal word lines NWL, but the memory block BKn includes the normal word lines NWL and redundant word lines RWL together.

Address information to select a specific memory block is pre-stored in an address latch and comparator 200 that operates to compare the pre-stored address information with an upper coding signal outputted from an X-address predecoder 50 during a refresh operation. When two addresses are hit in refresh operations, a normal word line enable signal NWEN and a redundant word line enable signal RWEN are activated at the same time. In addition, during a normal operation, the address latch and comparator 200 carries out an operation similar to the related art comparator 40 described above.

A plurality of row decoder and word line drivers 60-1~60-n that respectively correspond to the plurality of memory blocks BK0–BKn drive the normal word lines NWL. In order to drive the redundant word line RWL, a redundant row decoder and word line driver 300 that corresponds to the memory block BKn is also included. However, the present invention is not intended to be so limited. The normal word line NWL and the redundant word lines RWL can be located together in any one or more of the memory blocks BK0–BKn. Similarly, the redundant row decoder and word line driver 300 can be located in or associated with any one or more of the memory blocks BK0–BKn.

The operations of a fuse ROM array 20, a refresh counter 30 and an X-address predecoder 50 are identical to the operations of the related art memory. Therefore, identical reference numerals are used for the parts identical to the related art.

Operations of the preferred embodiment of a refresh scheme of the redundant word lines in the memory device of FIG. 2 will now be described. During normal operations, the address latch and comparator 200 sequentially compares an external address with the address information programmed in the fuse ROM array 20. Then, when two addresses are hit, the redundant word line enable signal RWEN is active. When the two addresses are missed, the normal word line enable signal NWEN is active.

When the two addresses are missed, the normal word line enable signal NWEN is active from the address latch and comparator 200. The plurality of row decoder and word line drivers 60-1~60-n are enabled by the normal word line enable signal NWEN. Pursuant to the upper coding signal outputted from the X-address predecoder 50, the plurality of row decoder and word line drivers 60-1~60-n select one memory block from the plurality of memory blocks BK0–BKn, for example, the memory block BK0. Pursuant to the lower coding signal, a selected word line of the normal word lines NWLs is driven in the selected memory block BK0.

When the two addresses are hit, the redundant word line enable signal RWEN is active from the address latch and comparator 200. Pursuant to the coding signal output by the X-address predecoder 50, the redundant row decoder and word line driver 300 drives the redundant word line RWL provided in the memory block BKn. Accordingly, within one bank, any of the normal word lines NWL, for example, in the plurality of memory blocks BK0–BKn-1 can be repaired by the redundant word line RWL in the memory block BKn.

During refresh operations of the preferred embodiment, in accordance with a refresh order illustrated in FIG. 3A, the refresh counter 30 sequentially generates the internal address and provides the internal address to the address latch and comparator 200. The X-address predecoder 50 outputs the upper coding signal and the lower coding signal by decoding the internal address outputted from the refresh counter 30.

The address latch and comparator 200 compares the pre-stored address information with the upper coding signal outputted from the X-address predecoder 50. When a specific or selected memory block, for example the memory block BK0 is selected, the normal word line enables signal NWEN and the redundant word line enable signal RWEN are simultaneously active, as illustrated in FIGS. 3B and 3C. Pursuant to the lower coding signal, a selected word line in the normal word lines NWL in BK0 and the redundant word lines RWL is driven.

Therefore, the normal word lines NWL in the memory block BK0 are sequentially driven by the row decoder and word line driver 60-1. At the same time, the redundant word lines RWL in the memory block BKn are sequentially driven by the redundant row decoder and word line driver 300. Thus, the refresh operation is performed.

That is, in accordance with the present invention, when the specific block is selected, the refresh operation is simultaneously performed on the normal word line NWL and redundant word line RWL. The redundant word lines and normal word lines can both be refreshed at one time without distinction by the respective banks in the memory.

As described above, the preferred embodiment of a refresh scheme for redundant word lines has various advantages. In the refresh scheme for redundant word lines in accordance with the preferred embodiment of the present invention, only a single memory block (e.g., BKn) in a bank includes the redundant word lines. When the other memory blocks are accessed, except the memory block having the redundant word lines, the normal word lines and the redundant word lines are simultaneously driven. Accordingly, the refresh operation can be efficiently performed on the redundant word lines without increasing a refresh cycle. Further, a prescribed normal word line can be repaired by a redundant word line in an identical bank. In addition, when all or multiple banks are refreshed in the preferred embodiment, the refresh operation is carried out on the redundant word lines and normal word lines without distinction by the respective banks. Accordingly, all the banks can share a normal word line enable signal (e.g., NWEN) and a redundant word line enable signal (e.g., RWEN).

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A memory device, comprising:
   a plurality of banks, wherein each of the banks comprises,
      a plurality of sense amplifiers, and
      a plurality of memory blocks, each of the memory blocks coupled to a corresponding sense amplifier, wherein said each of the memory blocks has word, lines, wherein a designated one of the memory blocks has redundant word lines and wherein at least one of the memory blocks does not have the redundant word lines,
      a plurality of drivers for the word lines, wherein each of the drivers is coupled to a corresponding memory block, and
      a designated driver also coupled to the designated memory block to drive the redundant word lines; and
   a selector circuit that determines whether a selection signal corresponds to a stored information to select one of the plurality of drivers and the designated driver in a refresh operation.

2. The memory device of claim 1, wherein the selector circuit compares the stored information and the selection signal during the refresh operation to concurrently activate a selected word line of the normal word lines in a selected memory block and a selected redundant word line in the redundant word lines in the prescribed memory block when the compared information are equivalent.

3. The memory device of claim 1, wherein the redundant word lines in the designated memory block repair the word lines in at least two of the memory blocks in the corresponding bank.

4. The memory device of claim 1, wherein the redundant word lines and the word lines are refreshed in a single cycle.

5. The memory device of claim 1, wherein the selector circuit compares the stored information and the selection signal during a normal operation to activate a selected redundant word line in the redundant word lines in the designated memory block when compared information are equivalent and to activate a selected word line of the normal word lines in a selected memory block when the compared information are not equivalent, wherein only the designated memory block in said each of the banks has the redundant word lines.

6. The memory device of claim 1, further comprising a fuse array that stores the stored information, wherein the stored information is prestored address information that indicates defective addresses corresponding to the plurality of memory blocks in each of the banks.

7. The memory device of claim 1, further comprising a decoder that decodes the address signal to output a first signal and a second signal.

8. The memory device of claim 7, wherein the selector circuit compares the prestored address information with the first signal during the refresh operation to activate both a normal word line enable signal and a redundant word line enable signal when the compared information are equivalent, and wherein the drivers select a memory block of the plurality of memory blocks according to the first signal, and wherein according to the second signal, the redundant word line enable signal and the word line enable signal one of the plurality of drivers respectively and the designated driver respectively drive a selected word line of the normal word lines in the selected memory block and the redundant word lines in the prescribed memory block, concurrently.

9. The memory device of claim 7, further comprising a refresh counter that generates an internal address, wherein the internal address is the address signal during a refresh operation, and wherein an external address is the address signal during a normal operation.

10. The memory device of claim 1, wherein the selector circuit comprises:
   a predecoder coupled to the plurality of drivers and the designated driver that receives the selection signal and outputs a first coding signal and a second coding signal;
   a fuse array that includes a plurality of fuse ROMs, wherein each of the fuse ROMs stores address information for the redundant word lines to repair the corresponding bank;
   a counter that outputs the selection signal in the refresh operation; and
   a latch and compare unit coupled to the predecoder, the fuse array and the counter, wherein the latch and compare unit compares the selection signal to the address information in the fuse array.

11. A memory device, comprising:
   a plurality of banks, wherein each of the banks comprises,
      a plurality of sense amplifiers, and
      a plurality of memory blocks, each of the memory blocks coupled to a corresponding sense amplifier, wherein each of the memory blocks has word lines, and wherein a prescribed one of the memory blocks has both the word lines and redundant word lines;
   a predecoder that decodes an address signal to output an upper coding signal and a lower coding signal;
   a latch and compare unit that receives prestored address information regarding status of memory cells in the memory blocks to compare with the upper coding signal during a refresh operation to activate both a normal word line enable signal and a redundant word line enable signal when the compared information are equivalent; and
   a plurality of row decoder and word line drivers that select a memory block of the plurality of memory blocks according to the upper coding signal, and wherein first and second drivers of the plurality of row decoder and word line drivers concurrently drive (1) a selected word line of the normal word lines in the selected memory block and (2) the redundant word lines in the prescribed memory block, respectively, according to the lower coding signal, the redundant word line enable signal and the word line enable signal.

12. The memory device of claim 11, wherein the word line enable signal and the redundant word line enable signal are used by at least two of the plurality of banks.

13. The memory device of claim 11, wherein the redundant word lines in the prescribed memory block repair the word lines in the corresponding bank.

14. The memory device of claim 11, further comprising:

a fuse array that stores the prestored address information, wherein the prestored address information indicates defective addresses corresponding to the plurality of memory blocks in each of the banks; and a refresh counter that generates an internal address, wherein the internal address is the address signal during a refresh operation, wherein the predecoder decodes the internal address during the refresh operation.

15. The memory device of claim 11, wherein the predecoder decodes an external address signal as the address signal during a normal operation, and wherein the latch and compare unit activates one of a redundant word line enable signal when compared information are equivalent and activates a word line enable signal when the compared information are not equivalent during the normal operation.

16. The memory device claim 11, wherein the pre-stored address information determines whether the prescribed memory block is selected.

17. A method of operating a memory including a plurality of banks, each of the banks having a plurality of memory blocks with word lines, wherein each of the memory blocks is coupled to a corresponding sense amplifier, the method comprising:

providing a single prescribed one of the plurality of memory blocks in each of the plurality of banks with redundant word lines;

connecting each of a plurality of drivers to drive the word lines in a corresponding memory block;

connecting an additional driver to drive the redundant word lines;

receiving a selection signal; and determining whether the selection signal is equivalent to a stored information to select one of the plurality of drivers in a normal operation and to select two of the drivers in a refresh operation when the selection signal is equivalent to the stored information, wherein during the refresh operation when the selection signal is equivalent to the stored information a selected word line of the word lines in a selected memory block and a selected redundant word line in the redundant word lines are concurrently driven by the two drivers, wherein the two drivers are the additional driver and one of the plurality of drivers.

18. The method of claim 17, wherein at least one of the memory blocks in one of the plurality of banks do not include the redundant word lines, wherein the redundant word lines in the prescribed memory block repair the word lines in at least two of the memory blocks in the corresponding bank, and wherein the redundant word lines and the word lines are refreshed in a single cycle.

19. The method of claim 17, wherein the additional driver drives all the redundant word lines in one of the plurality of banks, and wherein the redundant word lines in the single prescribed block repair the word lines in at least two of the memory blocks in said one of the plurality of banks.

20. The method of claim 17, further comprising:

decoding the selection signal to output a first coding signal and a second signal; and comparing the stored information with the first signal and the second signal during the refresh operation to activate both a normal word line enable signal and a redundant word line enable signal when the compared information are equivalent, and wherein a memory block of the plurality of memory blocks is selected according to the first signal.

* * * * *